United States Patent
Chang et al.

(10) Patent No.: US 9,035,364 B2
(45) Date of Patent: May 19, 2015

(54) ACTIVE DEVICE AND FABRICATING METHOD THEREOF

(71) Applicant: Au Optronics Corporation, Hsinchu (TW)

(72) Inventors: Chih-Pang Chang, Taipei (TW); Hsing-Hung Hsieh, Changhua County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 13/875,283

(22) Filed: May 2, 2013

(65) Prior Publication Data

US 2013/0270556 A1    Oct. 17, 2013

Related U.S. Application Data

(63) Continuation-in-part of application No. 13/531,600, filed on Jun. 25, 2012.

(30) Foreign Application Priority Data

Apr. 13, 2012  (TW) .............................. 101113285 A
Dec. 14, 2012  (TW) .............................. 101147605 A

(51) Int. Cl.
  *H01L 29/786*  (2006.01)
  *H01L 29/66*  (2006.01)

(52) U.S. Cl.
  CPC ...... *H01L 29/7869* (2013.01); *H01L 29/66742* (2013.01); *H01L 29/78603* (2013.01)

(58) Field of Classification Search
  CPC ............ H01L 29/6659; H01L 29/7833; H01L 21/823807; H01L 29/665; H01L 29/6656
  USPC .......................................................... 257/288
  See application file for complete search history.

(56) References Cited

U.S. PATENT DOCUMENTS

| 5,844,647 A | 12/1998 | Maruno et al. |
| 7,238,965 B2 | 7/2007 | Kim |
| 7,674,659 B2 | 3/2010 | Kim |

(Continued)

FOREIGN PATENT DOCUMENTS

| CN | 1538530 | 10/2004 |
| CN | 1716635 | 1/2006 |
| EP | 1469526 | 10/2004 |

OTHER PUBLICATIONS

"Office Action of Taiwan Counterpart Application", issued on Aug. 15, 2014, p. 1-p. 10, in which the listed references were cited.

*Primary Examiner* — Thao X Le
*Assistant Examiner* — Long Le
(74) *Attorney, Agent, or Firm* — Jianq Chyun IP Office

(57) ABSTRACT

An active device and a fabricating method thereof are provided. The active device includes a buffer layer, a channel, a gate, a gate insulation layer, a source and a drain. The buffer layer is disposed on a substrate and has a positioning region. A thickness of a portion of the buffer layer in the positioning region is greater than a thickness of a portion of the buffer layer outside the positioning region. The channel is disposed on the buffer layer and in the positioning region. The gate is disposed above the channel. The gate insulation layer is disposed between the channel and the gate. The source and the drain are disposed above the channel and electrically connected to the channel.

5 Claims, 13 Drawing Sheets

(56) References Cited

U.S. PATENT DOCUMENTS

| | | |
|---|---|---|
| 2003/0047785 A1 | 3/2003 | Kawasaki et al. |
| 2003/0180991 A1* | 9/2003 | Seo et al. ............. 438/151 |
| 2004/0207015 A1 | 10/2004 | Kim |
| 2005/0285197 A1 | 12/2005 | Park |
| 2006/0071286 A1* | 4/2006 | Axelrod et al. ............. 257/414 |
| 2006/0244107 A1 | 11/2006 | Sugihara et al. |
| 2007/0051993 A1 | 3/2007 | Ho et al. |
| 2007/0187760 A1 | 8/2007 | Furuta et al. |
| 2007/0218602 A1 | 9/2007 | Kim |
| 2008/0237598 A1 | 10/2008 | Nakayama |
| 2011/0297949 A1 | 12/2011 | Lee et al. |
| 2012/0223301 A1* | 9/2012 | Ueda et al. ............. 257/43 |

* cited by examiner

ACTIVE DEVICE AND FABRICATING METHOD THEREOF

CROSS-REFERENCE TO RELATED APPLICATION

This application is a continuation-in-part application of and claims the priority benefit of a prior application Ser. No. 13/531,600, filed on Jun. 25, 2012, now pending. The prior application Ser. No. 13/531,600 claims the priority benefit of Taiwan application serial no. 101113285, filed on Apr. 13, 2012. This application also claims the priority benefit of Taiwan patent application serial no. 101147605, filed on Dec. 14, 2012. The entirety of each of the above-mentioned patent applications is hereby incorporated by reference herein and made a part of this specification.

BACKGROUND OF THE INVENTION

1. Field of the Invention

The present invention relates to an active device and a fabricating method thereof.

2. Description of Related Art

A thin film transistor liquid crystal display (TFT LCD) panel mainly consists of an active device array structure, a color filter array structure and a liquid crystal layer. The active device array structure includes multiple active devices arranged in array, i.e. an array of thin film transistors (TFTs), and a pixel electrode disposed in correspondence with each TFT. The TFT includes a gate, a channel, a drain and a source. The TFT serves as a switch element for a liquid crystal display unit.

An oxide semiconductor is a common material for fabricating the TFT. When the oxide semiconductor TFT is used as the switch element for the liquid crystal display unit, because the channel of the oxide semiconductor material has a high light transmittance, there has been an alignment difficulty in stacking other materials in subsequent processes. Although increasing the thickness of the channel of the oxide semiconductor material may decrease its light transmittance, it causes a threshold voltage shift of the channel. Therefore, when the oxide semiconductor TFT is used as the switch element, it is desired to achieve high alignment accuracy in the process without increasing the thickness of the oxide semiconductor.

SUMMARY OF THE INVENTION

Accordingly, the present invention is directed to an active device having a buffer layer with a positioning region, and a channel disposed in the positioning region and a portion of the buffer layer in the positioning region can serve as a positioning mark used in the fabrication process of the active device.

The present invention is also directed to a method for fabricating an active device. The active device has a buffer layer with a positioning region. A channel disposed in the positioning region and a portion of the buffer layer in the positioning region can facilitate alignment in subsequent processes.

The present invention provides an active device including a buffer layer, a channel, a gate, a gate insulation layer, a source and a drain. The buffer layer is disposed on a substrate and has a positioning region. A thickness of a portion of the buffer layer in the positioning region is greater than a thickness of a portion of the buffer layer outside the positioning region. The channel is disposed on the buffer layer and in the positioning region. The gate is disposed above the channel. The gate insulation layer is disposed between the channel and the gate. The source and the drain are disposed above the channel and electrically connected with the channel.

In one embodiment, the thickness of the portion of the buffer layer in the positioning region is X1, the thickness of the portion of the buffer layer outside the positioning region is X2, the thickness of the channel is Y, and the result of subtracting X2 from the sum of X1 and Y is equal to or greater than 40 or 60 nanometers. In addition, the result of subtracting X2 from X1 is, for example, equal to or greater than 20 nanometers.

In one embodiment, the thickness of the channel is equal to or less than 70 or 120 nanometers.

In one embodiment, the material of the buffer layer is silicon oxide (SiOx), silicon nitride (SiNx), silicon nitride-oxide (SiON), silicon carbide (SiC), silicon carbonitride (SiCN) or aluminum oxide (AlO).

In one embodiment, the active device further includes a first insulation layer covering the gate and the gate insulation layer. The source and the drain are disposed on the first insulation layer, and the source and the drain pass through the first insulation layer and the gate insulation layer to be electrically connected with the channel.

In one embodiment, the material of the channel is an oxide semiconductor.

In one embodiment, the material of the channel includes indium-gallium-zinc oxide (IGZO), zinc oxide (ZnO), tin oxide (SnO), indium-zinc oxide (IZO), gallium-zinc oxide (GZO), zinc-tin oxide (ZTO), indium-gallium oxide (IGO), indium-tin-zinc oxide (ITZO), or indium-tin oxide (ITO).

In one embodiment, the gate insulation layer includes a primary insulation layer and a secondary insulation layer. The primary insulation layer covers the channel and the buffer layer, and the secondary insulation layer covers the channel.

In one embodiment, the thickness of the secondary insulation layer is equal to or greater than 20 nanometers. The thickness of the secondary insulation layer is, for example, X3, the thickness of the portion of the buffer layer in the positioning region is X1, and the sum of X3 and X1 is equal to or greater than 20 nanometers. Alternatively, the thickness of the secondary insulation layer is, for example, X3, the thickness of the portion of the buffer layer in the positioning region is X1, the thickness of the portion of the buffer layer outside the positioning region is X2, and the result of subtracting X2 from the sum of X3 and X1 is equal to or greater than 20 nanometers.

The present invention provides a method for fabricating an active device. In this method, a buffer layer is first formed on a substrate. A channel material layer is then formed on the buffer layer, and this channel material layer is patterned to form a channel later. The buffer layer has a positioning region, and a thickness of a portion of the buffer layer in the positioning region is greater than a thickness of a portion of the buffer layer outside the positioning region. The channel is disposed on the buffer layer and in the positioning region. After the channel and the buffer layer with two thicknesses, a gate insulation layer is then formed on the channel. A gate is then formed on the gate insulation layer, with the channel and the portion of the buffer layer below the channel being used as an alignment mark. Finally, a source and a drain are formed which are above the channel and electrically connected to the channel.

In one embodiment of the fabricating method of the active device, the step of forming the channel includes patterning the channel material layer to form the channel, and thinning the portion of the buffer layer that is not covered by the channel, such that the thickness of the portion of the buffer layer below the channel is greater than the thickness of the portion of the buffer layer that is not covered by the channel.

In one embodiment of the fabricating method of the active device, the method of forming the channel and thinning the portion of the buffer layer that is not covered by the channel include the following steps. An etch mask is formed on a region of the channel material layer where the channel is to be formed. The portion of the channel material layer that is not covered by the etch mask is etched to form the channel, and then the portion of the buffer layer that is not covered by the channel is etched. Finally, the etch mask is removed.

In one embodiment of the fabricating method of the active device, the step of forming the channel includes patterning the channel material layer and the buffer layer simultaneously to form the channel layer and the buffer layer having two thicknesses.

In one embodiment of the fabricating method of the active device, the method further includes, after the gate is formed and before the source and the drain are formed, forming a first insulation layer to cover the gate and the gate insulation layer, with the source and the drain passing through the first insulation layer and the gate insulation layer to be electrically connected with the channel.

The present invention provides another active device including a channel, a gate, a gate insulation layer, a source and a drain. The channel is disposed on a substrate. The gate is disposed above the channel. The gate insulation layer includes a primary insulation layer and a secondary insulation layer, and is disposed between the channel and the gate. The source and the drain are disposed above the channel and electrically connected to the channel.

In one embodiment, the primary insulation layer covers the channel and the substrate, and the secondary insulation layer covers the channel.

In one embodiment, the thickness of the secondary insulation layer of the active device is equal to or greater than 20 nanometers.

In one embodiment, the active device further includes a buffer layer disposed on the substrate. The channel is disposed on the buffer layer. In addition, the buffer layer, for example, has a positioning region. The channel is located in the positioning region. A thickness of a portion of the buffer layer in the positioning region is greater than a thickness of a portion of the buffer layer outside the positioning region.

In one embodiment, the thickness of the portion of the buffer layer in the positioning region is, for example, X1, the thickness of the portion of the buffer layer outside the positioning region is X2, the thickness of the channel is Y, and the result of subtracting X2 from the sum of X1 and Y is equal to or greater than 40 or 60 nanometers. In addition, the result of subtracting X2 from X1 is, for example, equal to or greater than 20 nanometers.

In one embodiment, the thickness of the secondary insulation layer is X3, the thickness of the portion of the buffer layer in the positioning region is X1, and the sum of X3 and X1 is equal to or greater than 20 nanometers. Alternatively, the thickness of the secondary insulation layer is, for example, X3, the thickness of the portion of the buffer layer in the positioning region is X1, the thickness of the portion of the buffer layer outside the positioning region is X2, and the result of subtracting X2 from the sum of X3 and X1 is equal to or greater than 20 nanometers.

In one embodiment, the material of the buffer layer is silicon oxide (SiOx), silicon nitride (SiNx), silicon nitride-oxide (SiON), silicon carbide (SiC), silicon carbonitride (SiCN) or aluminum oxide (AlO).

In one embodiment, the thickness of the channel is equal to or less than 70 or 120 nanometers.

In one embodiment, the active device further includes a first insulation layer covering the gate. The source and the drain are disposed on the first insulation layer, and the source and the drain pass through the first insulation layer to be electrically connected with the channel.

In one embodiment, the material of the channel is an oxide semiconductor.

In one embodiment, the material of the channel includes indium-gallium-zinc oxide (IGZO), zinc oxide (ZnO), tin oxide (SnO), indium-zinc oxide (IZO), gallium-zinc oxide (GZO), zinc-tin oxide (ZTO), indium-gallium oxide (IGO), indium-tin-zinc oxide (ITZO), or indium-tin oxide (ITO).

The present invention provides another method for fabricating an active device. In this method, a channel material layer and an insulation photoresist material layer are first formed on a substrate in sequence. Then, the insulation photoresist material layer is patterned to form a secondary insulation layer. Afterward, the channel material layer is patterned to form a channel by using the secondary insulation layer as a mask. Then, a primary insulation layer is formed to cover the secondary insulation layer and the substrate. In particular, the primary insulation layer and the secondary insulation layer constitute a gate insulation layer. Then, a gate is formed on the gate insulation layer, with the channel and the secondary insulation layer being used as an alignment mark. Thereafter, a source and a drain are formed which are above the channel and electrically connected to the channel.

In one embodiment of the fabricating method of the active device, the method further includes forming a buffer layer before the channel material layer is formed.

In one embodiment of the fabricating method of the active device, the method further includes, after the channel is formed and before the primary insulation layer is formed, thinning the portion of the buffer layer that is not covered by the channel, such that the thickness of the portion of the buffer layer below the channel is greater than the thickness of the portion of the buffer layer that is not covered by the channel. In addition, the steps of forming the channel and thinning the buffer layer are, for example, completed simultaneously by using the secondary insulation layer as a mask.

In one embodiment of the fabricating method of the active device, the method further includes, after the gate is formed and before the source and the drain are formed, forming a first insulation layer to cover the gate, with the source and the drain passing through the first insulation layer to be electrically connected with the channel.

In view of the foregoing, in the present active device and the fabricating method thereof, the thickness of the portion of the buffer layer below the channel is greater than the thickness of the rest part of the buffer layer. Therefore, the channel and the buffer layer below the channel can serve as an alignment mark used in the fabrication process. In addition, when the gate insulation layer includes the secondary insulation layer, a relatively flat surface can be obtained to avoid plasma damage.

In order to make the aforementioned features and advantages of the invention more comprehensible, embodiments accompanied with figures are described in detail below.

DESCRIPTION OF THE EMBODIMENTS

Figure 1A:
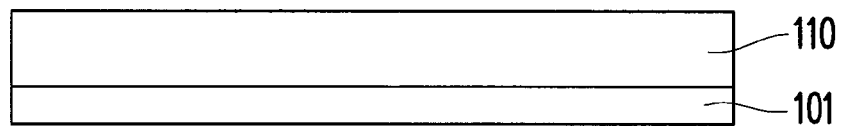
FIG. 1A to FIG. 1I are cross-sectional views illustrating a flow of a method for manufacturing an active device according to one embodiment of the present invention.
Figure 1B:
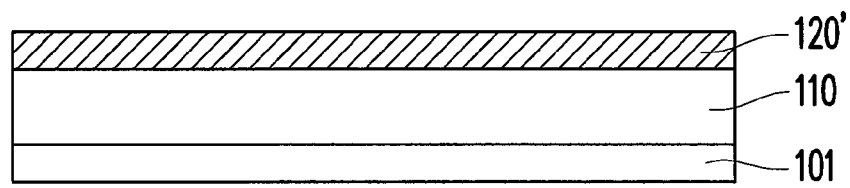

FIG. 1A to FIG. 1I are cross-sectional views illustrating a flow of a method for manufacturing an active device according to one embodiment of the present invention. Referring first to FIG. 1A, a substrate 101 is provided, which is, for example, a glass substrate or a plastic substrate. A buffer layer 110 is then formed on the substrate 101. Referring to FIG. 1B, a channel material layer 120' is then formed on the buffer layer 110. The buffer layer 110 can prevent impurities in the substrate 101 from diffusing into the channel material layer 120' which would contaminate the channel material layer 120' or even further affect the electricity of the active device 100 when driven. In addition, since the buffer layer 110 covers the entire substrate 101, the buffer layer 110 can also suppress the degree of warp of the substrate 101.

Figure 1C:
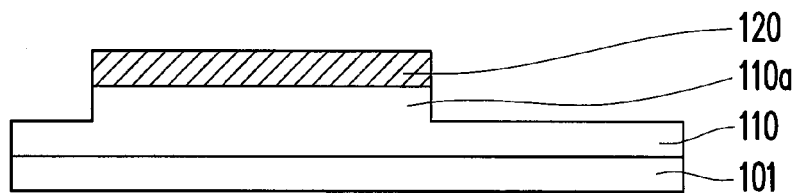

Referring to FIG. 1C, the channel material layer 120' may be patterned to form a channel 120 after the buffer layer 110 and the channel material layer 120' are formed on the substrate 101. The buffer layer 110 includes a positioning region 110a, and a thickness of the portion of the buffer layer 110 in the positioning region 110a is greater than a thickness of the portion of the buffer layer 110 outside the positioning region 110a. The channel 120 formed from the channel material layer 120' is disposed on the buffer layer 110 and located in the positioning region 110a.

Figure 1D:
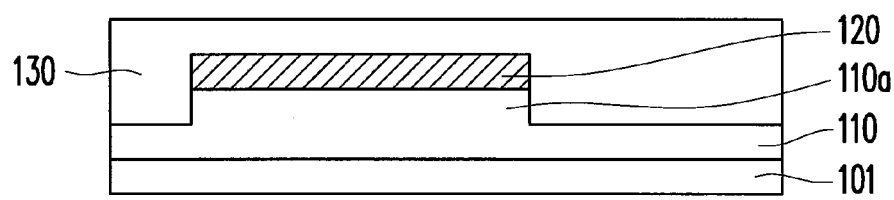

Referring to FIG. 1D, after the channel 120 and the buffer layer 110 with two thicknesses are formed, a gate insulation layer 130 is formed over the channel 120. The gate insulation layer 130 has insulation result and can isolate the channel 120 from a gate 140 to be formed later (shown in FIG. 1E). The method for forming the gate insulation layer 130 may be, but not limited to, chemical vapor deposition (CVD). The gate insulation layer 130 may also be formed using other methods, such as, screen printing, coating, ink-jetting, energy source processing, or the like. The present invention has no limits as to the formation of the gate insulation layer 130.

Figure 1E:
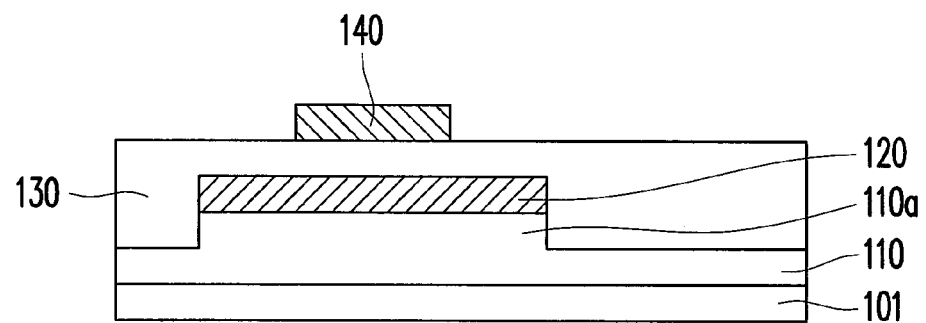

Referring to FIG. 1E, a gate 140 is formed on the gate insulation layer 130. In comparison with the buffer layer 110 outside the positioning region 110a, the stacked channel 120 in the positioning region 110a and the buffer layer 110 in the positioning region 110a have a relatively greater thickness and therefore has a different light transmittance than that of the buffer layer 110 outside the positioning region 110a. In forming the gate 140 on the gate insulation layer 130, the channel 120 and the portion of the buffer layer 110 below the channel 120 may serve as an alignment mark by taking advantage of this difference in light transmittance. In other words, in forming the gate 140 in the subsequent process, alignment of the gate 140 can be achieved without using additional alignment pattern.

Figure 1F:
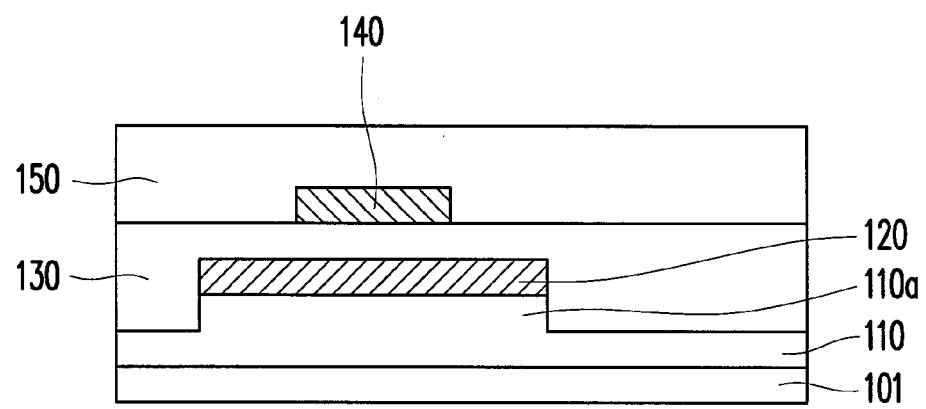

Referring to FIG. 1F, after the gate 140 is formed, a first insulation layer 150 is then formed. The first insulation layer 150 covers both the gate 140 and the gate insulation layer 130. Referring again to FIG. 1G, a source 160 and a drain 170 are formed above the channel 120 and are electrically connected with the channel 120. The source 160 and the drain 170 are spaced a distance and pass through the first insulation layer 150 and the gate insulation layer 130 to be electrically connected with the channel 120 therebelow. The active device of this embodiment is thus generally accomplished. Discussed below are some other optional steps.

Figure 1G:
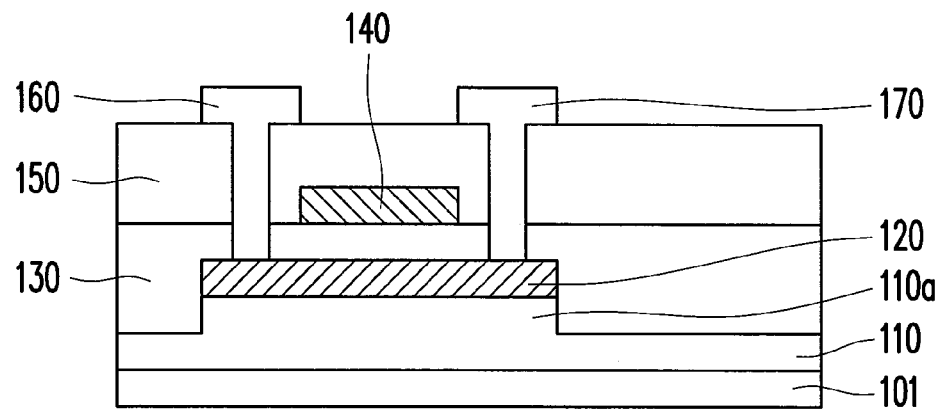
Figure 1H:
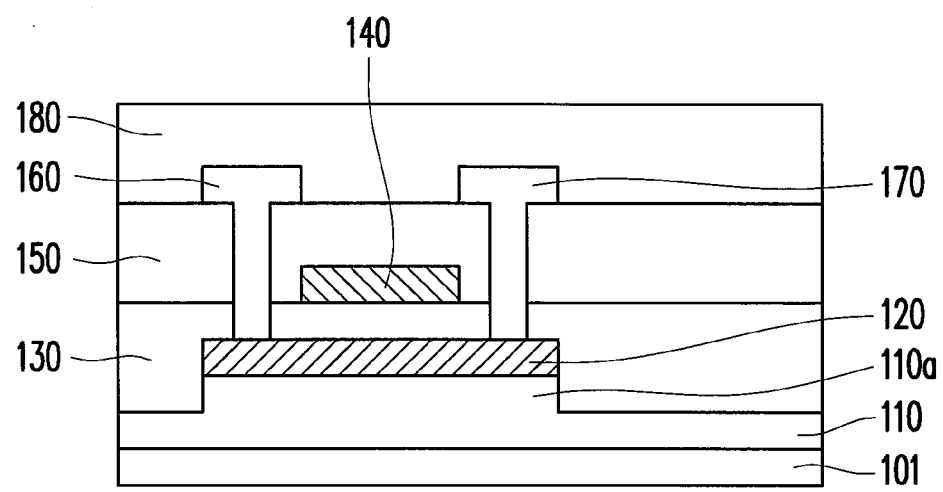
Figure 1I:
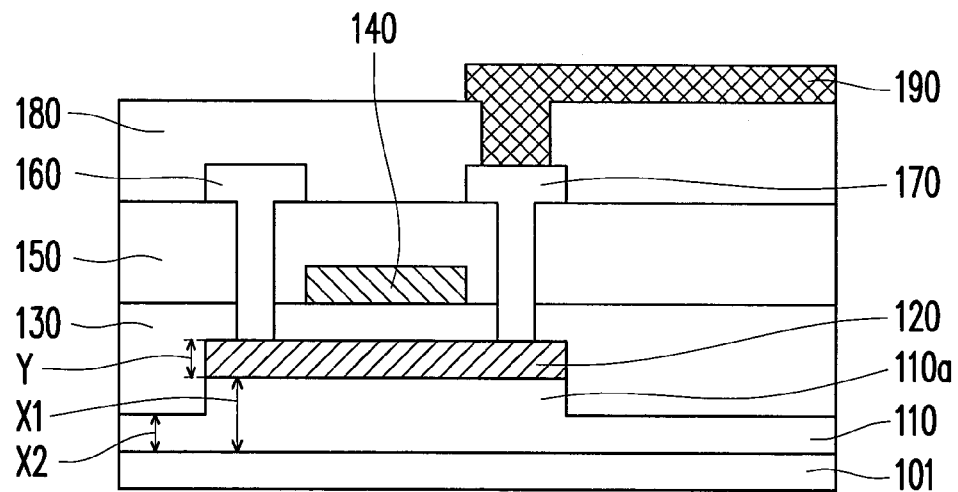

Referring to FIG. 1H, after the source 160 and the drain 170 are formed, a second insulation layer 180 is then formed to cover the source 160 and the drain 170. Referring to FIG. 1I, a pixel electrode 190 is formed on the second insulation layer 180, and the pixel electrode 190 and the drain 170 are electrically connected.

Figure 2A:
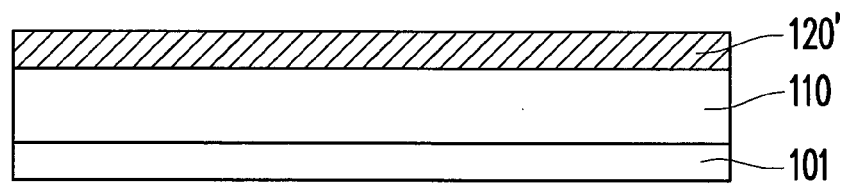
FIG. 2A to FIG. 2F are cross-sectional views illustrating the flow of the method of fabricating the channel and the buffer layer of FIG. 1C.
Figure 2B:
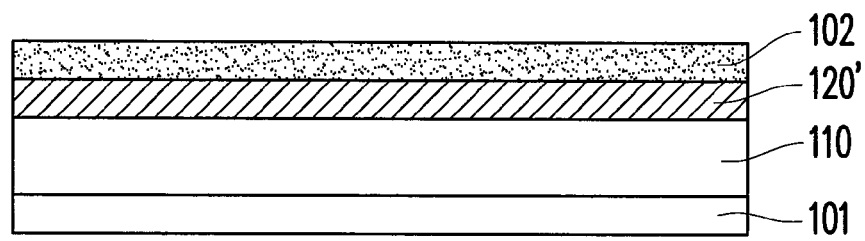

FIG. 2A to FIG. 2F are cross-sectional views illustrating the flow of the method of fabricating the channel and the buffer layer of FIG. 1C. Referring to FIG. 2A and FIG. 2B, after obtaining the semi-finished product shown in FIG. 1B, a photoresist material layer 102 may be coated on the channel material layer 120' using a coating method such as spin coating or slot die coating, such that the photoresist material layer 102 covers the channel material layer 120'.

Figure 2C:
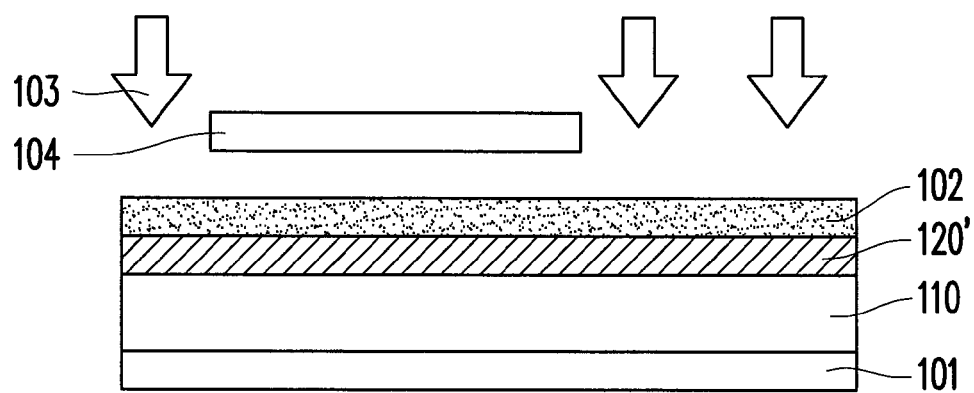

Referring to FIG. 2C, the photoresist material layer 102 is exposed to an ultraviolet light 103 through a photo mask 104. The design of the pattern (distribution of the shielding region and the transparent region) of the photo mask 104 may vary according to photosensitivity of the photoresist material layer 102. For example, the pattern design of the photo mask 104 for the photoresist material layer 102 having a positive photosensitivity is inverted with respect to the mask pattern design for the photoresist material layer 102 having a negative photosensitivity.

Figure 2D:
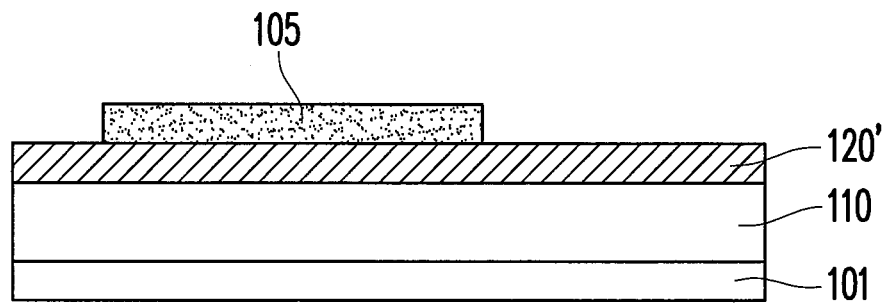

Referring to FIG. 2C and FIG. 2D, a development step is executed using a developing solution such that part of the photoresist material layer 102 is removed. In the present embodiment, the photoresist material used has a positive photosensitivity. Therefore, the exposed part of the photoresist material layer 102 is dissolved in the developing solution so as to be removed and the rest part remains on the channel material layer 120' to form an etch mask 105 in the region where the channel 120 is to be formed.

Figure 2E:
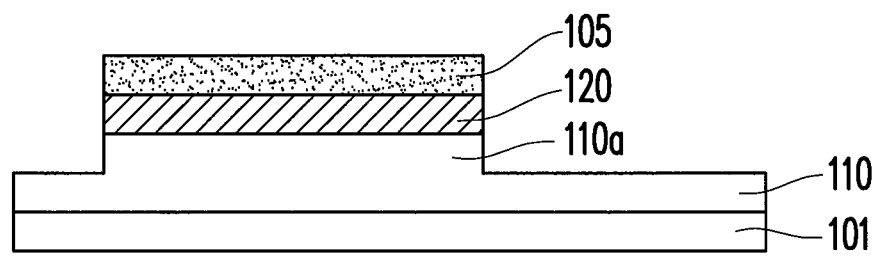

Referring to FIG. 2E, after the etch mask 105 is formed, an etch operation may be performed on the underlying channel material layer 120' and the buffer layer 110 through the etch mask 105. Notably, etch can be performed in two manners. The first manner is layered etch. The part of the channel material layer 120' that is not covered by the etch mask 105 is etched to form the channel 120. After the channel 120 is formed, a second etch is performed to remove the part of the buffer layer 110 that is not covered by the etch mask 105. In the second manner, the channel material layer 120' and the buffer layer 110 are patterned simultaneously to form the channel 120 and the buffer layer 110 having two thicknesses. At the step shown in FIG. 2E, the channel material layer 120' is etched to form the channel 120, and the buffer layer 110 that originally had a uniform thickness is etched to have two portions with different thicknesses. The thickness of the portion of the buffer layer 110 in the positioning region 110a is greater than the thickness of the portion of the buffer layer 110 outside the positioning region 110a.

Figure 2F:
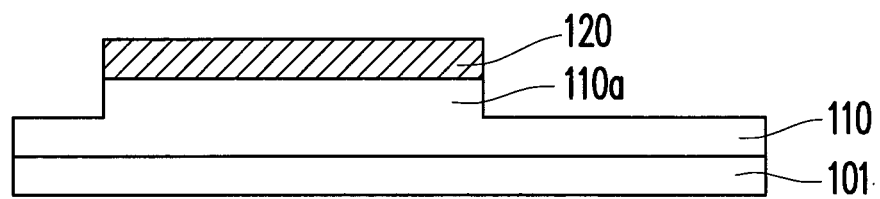

Referring to FIG. 2F, finally, the etch mask 105 disposed on and contacting the channel 120 shown in FIG. 2E is removed, and a structure on the substrate 101 that includes the buffer layer 110 with the positioning region 110a and the channel 120 is thus obtained. This structure may serve as the alignment mark for the formation of the gate 140 in a subsequent process.

In addition, in FIG. 1E, FIG. 1G and FIG. 1I, the gate 140, source 160, drain 170 and pixel electrode 190 are likewise formed using a photo process similar to that illustrated in FIG. 2A to FIG. 2F. The only difference is that the pattern of the photo mask 104 used in FIG. 2C needs to change according to the desired shape of the gate 140, source 160, drain 170 and pixel electrode 190. Therefore, further explanation of the photo process is not repeated herein.

FIG. 1I illustrates an active device according to one embodiment of the present invention. Referring to FIG. 1I, the active device 100 includes a buffer layer 110, a channel 120, a gate 140, a gate insulation layer 130, a source 160 and a drain 170. The buffer layer 110 is disposed on a substrate 101. The buffer layer 110 has a positioning region 110a. A thickness of a portion of the buffer layer 110 in the positioning region 110a is greater than a thickness of a portion of the buffer layer 110 outside the positioning region 110a. The channel 120 is disposed on the buffer layer 110 and in the positioning region 110a. The gate 140 is disposed above the channel 120. A gate insulation layer 130 is disposed between the channel 120 and the gate 140. The source 160 and the drain 170 are disposed above the channel 120 and electrically connected with the channel 120.

In the active device 100 of the present embodiment, the buffer layer 110 and the channel 120 in the positioning region 110a can collectively serve as a positioning mark. Therefore, even if the thickness of the channel 120 is controlled to be less than 70 or 120 nanometers, it would not cause the alignment difficulty in subsequent processes due to the over-thin thickness. In addition, when the material of the channel 120 is an oxide semiconductor, controlling the channel 120 to have a suitable thickness can also avoid the threshold voltage shift issue of the channel 120.

The thickness of the portion of the buffer layer 110 in the positioning region 110a is X1, the thickness of the portion of the buffer layer 110 outside the positioning region 110a is X2, and the thickness of the channel 120 is Y. The result of subtracting X2 from the sum of X1 and Y is equal to or greater than 40 or 60 nanometers. In other words, the sum of the thickness of the portion of the buffer layer 110 in the positioning region 110a and the thickness of the channel 120 must be greater than the thickness of the portion of the buffer layer 110 outside the positioning region 110a, such that the light transmittance of the positioning region 110a and the light transmittance of the portion outside the positioning region 110a have a sufficient difference for the fabrication equipment to identify to achieve the positioning result. In addition, the result of subtracting X2 from X1 is, for example, equal to or greater than 20 nanometers, such that the thickness of the portion of the buffer layer 110 in the positioning region 110a is significantly different from the thickness of the portion of the buffer layer 110 outside the positioning region 110a. The thickness of the channel 120 can be equal to or less than 70 nanometers. The material of the buffer layer 110 is an insulation material, for example, a metal oxide material such as, silicon oxide (SiOx), silicon nitride (SiNx), silicon nitride-oxide (SiON), silicon carbide (SiC), silicon carbonitride (SiCN) or aluminum oxide (AlO). The material of the channel 120 may be an oxide semiconductor, such as, indium-gallium-zinc oxide (IGZO), zinc oxide (ZnO), tin oxide (SnO), indium-zinc oxide (IZO), gallium-zinc oxide (GZO), zinc-tin oxide (ZTO), indium-gallium oxide (IGO), indium-tin-zinc oxide (ITZO), or indium-tin oxide (ITO).

As shown in FIG. 1I, the active device 100 of the present embodiment further includes a first insulation layer 150. The first insulation layer 150 covers the gate 140 and the gate insulation layer 130. The source 160 and the drain 170 are disposed on the first insulation layer 150, and the source 160 and the drain 170 pass through the first insulation layer 150 and the gate insulation layer 130 to be electrically connected with the channel 120.

The material of the gate 140, source 160 and drain 170 may be a metal such as aluminum (Al), molybdenum (Mo), chromium (Cr), tantalum (Ta), titanium (Ti), gold (Au) or silver (Ag) or any alloy thereof, an alloy such as Al—Nd, APC, or a conductive metal oxide such as tin oxide (SnO), zinc oxide (ZnO), indium oxide, indium-tin oxide (ITO) or indium-zinc oxide (IZO). It is noted, however, the present invention is not intended to limit the material of the gate 140, source 160 and drain 170 to any particular material.

Referring to FIG. 1I, the active device 100 of the present embodiment may further include a second insulation layer 180 and a pixel electrode 190. The material of the pixel electrode 190 may be, for example, indium-tin oxide (ITO) or aluminum zinc oxide (AZO). It is noted, however, that the present invention is not intended to limit the material of the pixel electrode 190 to any particular material.

Additional embodiments are discussed below. It should be mentioned that, the embodiments below use the same device labels and portions of the content from previous embodiments. Specifically, the same labels are used to represent the same or similar devices, and the descriptions for the same techniques are omitted. The omitted portions have been discussed in the previous embodiments, and are not repeated herein.

Figure 3:
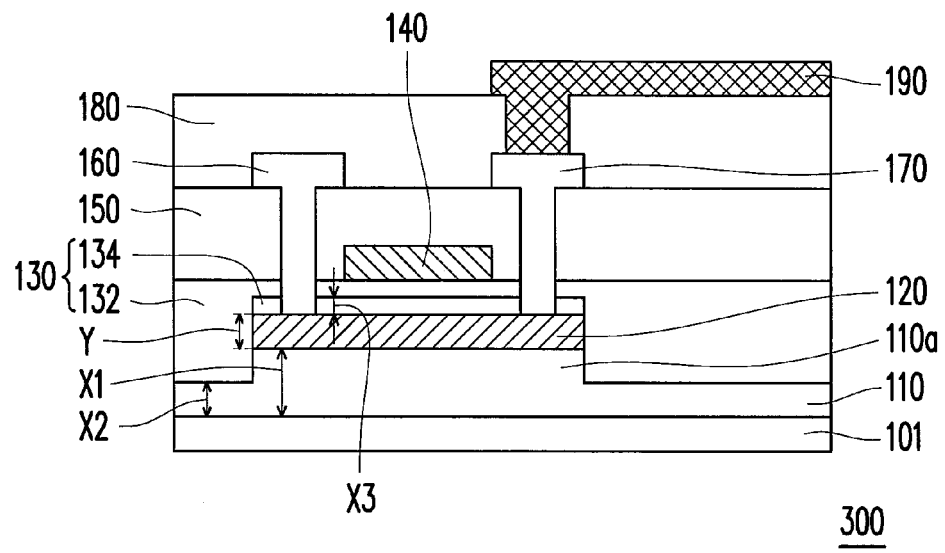
FIG. 3 is an active device according to another embodiment of the present invention.

FIG. 3 is an active device according to another embodiment of the present invention. Referring to FIG. 3, the gate insulation layer 130 of the active device 300 of the present embodiment includes a primary insulation layer 132 and a secondary insulation layer 134. The primary insulation layer 132 covers the channel 120 and the buffer layer 110, and the secondary insulation layer 134 covers the channel 120. The material of the secondary insulation layer 134 of the present embodiment is exemplified by a photoresist material, and the secondary insulation layer 134 can be used as an etch mask to define the channel 120 and the positioning region 110a of the buffer layer 110. The secondary insulation layer 134 can further differentiate the light transmittance between the positioning region 110a and the area outside the positioning region 110a, and be used as an alignment pattern to form the gate 140 in a subsequent process. In addition, the present embodiment is exemplified by the secondary insulation layer 134 completely covering the channel 120, but the secondary insulation layer 134 can also cover the portion of the buffer layer 110 outside the positioning region 110a. The configuration of the secondary insulation layer 134 makes the interface between the secondary insulation layer 134 and the channel 120 relatively flat. In addition, when the secondary insulation layer 134 is made of a photoresist material, plasma damage to the surface of the channel 120 can be avoided. When the material of the secondary insulation layer 134 is an inorganic material, since the film thickness of the secondary insulation layer 134 is less than the film thickness of the primary insulation layer 132, the degree of plasma damage can still be lowered when the channel 120 directly covers the primary insulation layer 132.

In one embodiment, the thickness of the secondary insulation layer 134 is equal to or greater than 20 nanometers. In addition, the thickness of the secondary insulation layer 134 is, for example, X3, the thickness of the portion of the buffer layer 110 in the positioning region 110a is X1, and the sum of X3 and X1 is equal to or greater than 20 nanometers. Alternatively, the thickness of the secondary insulation layer 134 is, for example, X3, the thickness of the portion of the buffer layer 110 in the positioning region 110a is X1, the thickness of the portion of the buffer layer 110 outside the positioning region 110a is X2, and the result of subtracting X2 from the sum of X3 and X1 is equal to or greater than 20 nanometers. The material of the secondary insulation layer 134 can also be an inorganic thin film, for example, an insulation material such as silicon oxide (SiOx), silicon nitride (SiNx) or aluminum oxide (AlOx). The primary insulation layer 132 can also be an inorganic thin film. The material of the primary insulation layer 132 and the secondary insulation layer 134 can be the same or different.

Figure 4:
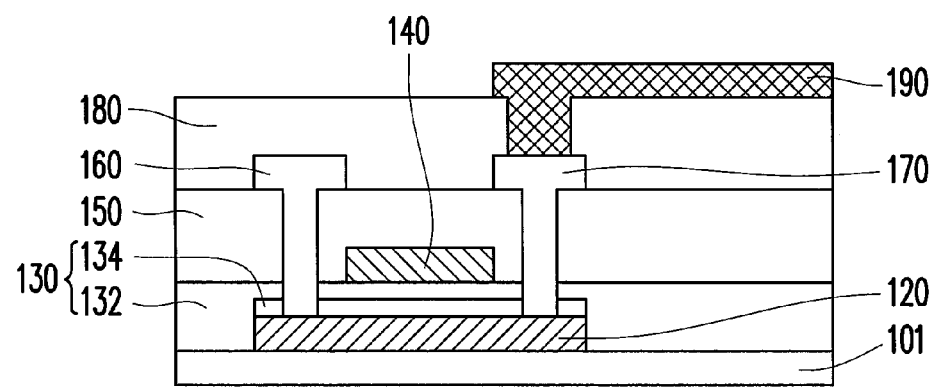
FIG. 4 is an active device according to yet another embodiment of the present invention.

FIG. 4 is an active device according to yet another embodiment of the present invention. Referring to FIG. 4, the active device 400 of the present embodiment is similar to the active device 300 of FIG. 3, with the difference being that the active device 400 of the present embodiment does not have a buffer layer. Although the buffer layer 110 of FIG. 3 is absent, the secondary insulation layer 134 of the gate insulation layer 130 can still be used as an alignment pattern to form the gate 140 in a subsequent process. In addition, the secondary insulation layer 134 can be used as an etch mask to define the channel 120.

Figure 5A:
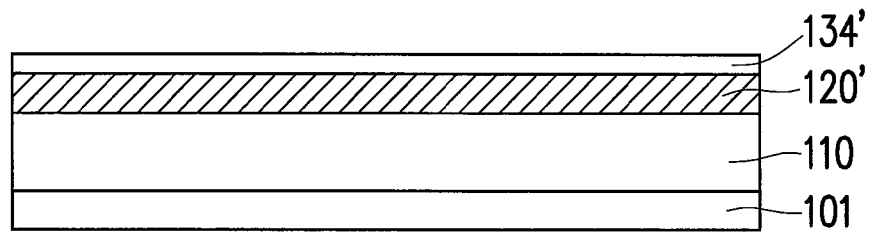
FIG. 5A to FIG. 5F are cross-sectional views illustrating the flow of the method for manufacturing an active device according to another embodiment of the present invention.

FIG. 5A to FIG. 5F are cross-sectional views illustrating the flow of the method for manufacturing an active device according to another embodiment of the present invention. Referring to FIG. 5A, in the method of the present embodiment for fabricating an active device, a buffer layer 110 is first optionally formed on a substrate 101. Then, a channel material layer 120' and an insulation photoresist material layer 134' are formed on the buffer layer 110 in sequence.

Figure 5B:
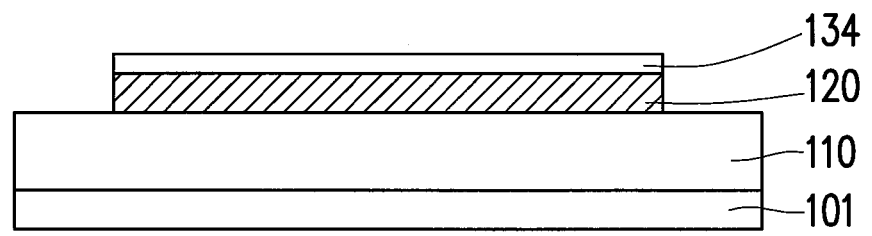

Then, referring to FIG. 5A and FIG. 5B, the insulation photoresist material layer 134' is patterned to form a secondary insulation layer 134, and a channel 120 is formed by patterning the channel material layer 120' and by using the secondary insulation layer 134 as a mask. Since the insulation photoresist material layer 134' is itself a photoresist material, when the insulation photoresist material layer 134' is patterned, the development of the insulation photoresist material layer 134' via exposure can be completed using only a photo mask. Later, when the channel material layer 120' is patterned, a photo mask will no longer be needed.

Figure 5C:
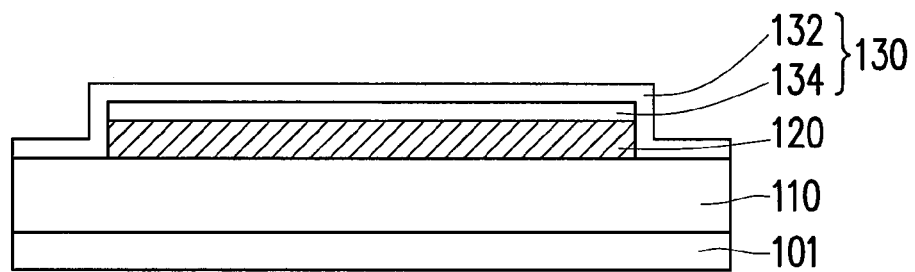

Then, referring to FIG. 5C, a primary insulation layer 132 is formed to cover the secondary insulation layer 134, buffer layer 110, and substrate 101. In particular, the primary insulation layer 132 and the secondary insulation layer 134 constitute a gate insulation layer 130.

Figure 5D:
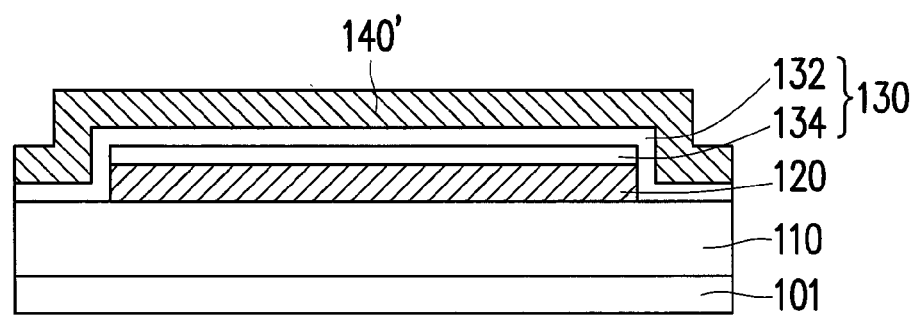

Then, referring to FIG. 5D, a gate material layer 140' is formed on the gate insulation layer 130.

Figure 5E:
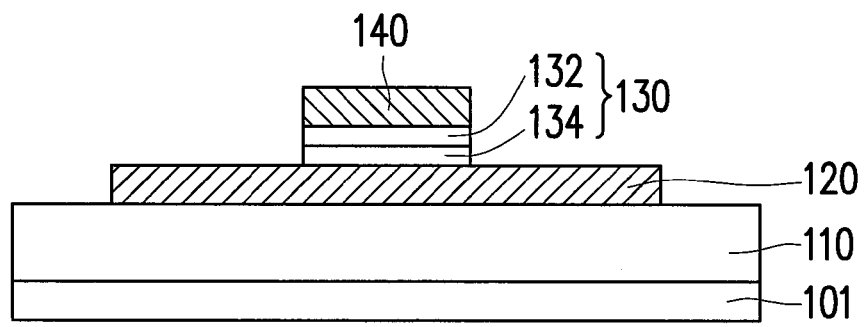

Then, referring to FIG. 5E, a gate 140 is formed on the gate insulation layer 130, with the channel 120 and the secondary insulation layer 134 being used as an alignment mark. In addition, after the gate 140 is formed, by optionally using the gate 140 as an etch mask, the portion of the gate insulation layer 130 not covered by the gate 140 can be etched to expose a portion of the channel 120.

Figure 5F:
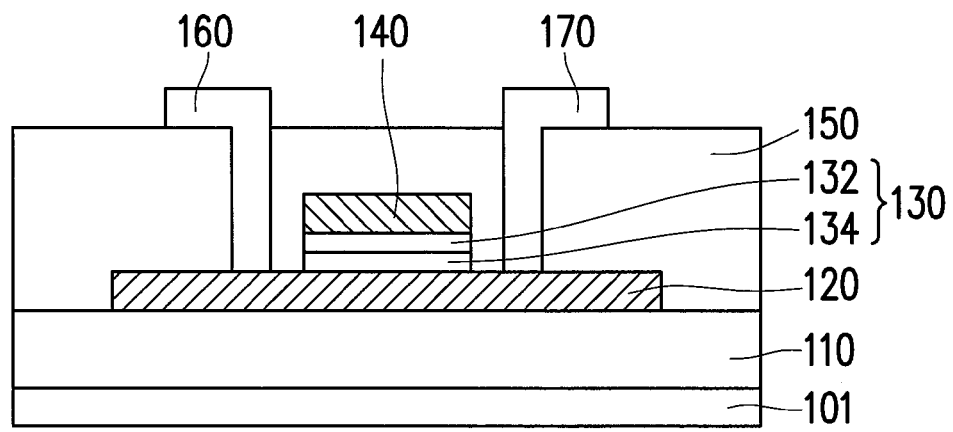

Next, referring to FIG. 5F, a first insulation layer 150 is optionally formed to cover the gate 140. If the portion of the gate insulation layer 130 not covered by the gate 140 was not removed in the previous step, then the first insulation layer 150 also covers the gate insulation layer 130. Then, a source 160 and a drain 170 are formed on the first insulation layer 150 above the channel 120, and the source 160 and the drain 170 pass through the first insulation layer 150 to be electrically connected with the channel 120.

Figure 6:
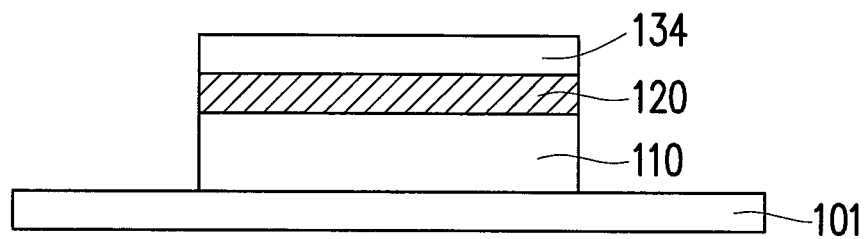
FIG. 6 and FIG. 7 are cross-sectional views illustrating steps for forming a channel in the method for manufacturing an active device according to two other embodiments of the present invention.
Figure 7:
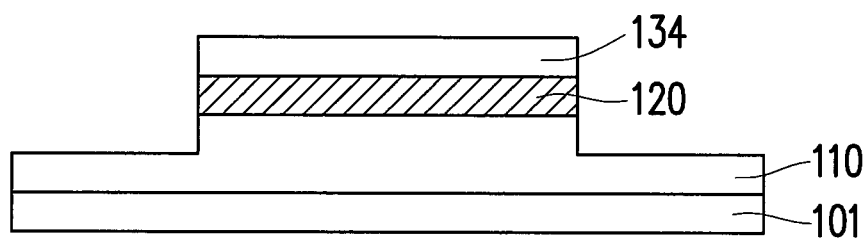

FIG. 6 and FIG. 7 are cross-sectional views illustrating steps for forming a channel in the method for manufacturing an active device according to two other embodiments of the present invention. Referring to FIG. 6, in the method of the present embodiment for fabricating an active device, when the channel 120 is formed by using the secondary insulation layer 134 as a mask, the portion of the buffer layer 110 not covered by the channel 120 can be removed at the same time to expose the substrate 101. Then, the subsequent steps of, for example, FIG. 5C to FIG. 5F are performed. Next, referring to FIG. 7, in the method of the present embodiment for fabricating an active device, when the channel is formed by using the secondary insulation layer 134 as a mask, the portion of the buffer layer 110 not covered by the channel 120 can be thinned at the same time, such that the thickness of the portion of the buffer layer 110 below the channel 120 is greater than the thickness of the portion of the buffer layer 110 not covered by the channel 120. Then, the subsequent steps of, for example, FIG. 5C to FIG. 5F are performed.

In summary, in the active device of the present invention, the stacked structure itself can serve as a positioning mark for use in the fabricating process of the active device. This positioning mark consists of the buffer layer and the channel in the positioning region. The thickness of the stacked buffer layer and channel in the positioning region is greater than the thickness of the portion of the buffer layer outside the positioning region. Therefore, the stacked buffer layer and channel in the positioning region and the buffer layer outside the positioning region have different light transmittance. The stacked structure may serve as the positioning mark for use in subsequent processes by taking advantage of the difference in light transmittance.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating an active device, comprising:
   forming a buffer layer on a substrate;
   forming a channel material layer on the buffer layer;
   forming a channel, wherein the buffer layer having a positioning region, a thickness of a portion of the buffer layer in the positioning region is greater than a thickness of a portion of the buffer layer outside the positioning region, and the channel is disposed on the buffer layer and in the positioning region, and wherein the channel and a portion of the buffer layer below the channel together form an alignment mark corresponding to the positioning region;
   after the step of forming the alignment mark, forming a gate insulation layer entirely covering the channel and the buffer layer so that light transmittances of the positioning region and outside the positioning region are different;
   using the alignment mark by the different light transmittances to form a gate on the gate insulation layer which is entirely covering the channel and the buffer layer; and
   forming a source and a drain that are above the channel and electrically connected to the channel.

2. The method for fabricating the active device according to claim 1, wherein the step of forming the channel comprises:
   patterning the channel material layer to form the channel;
   thinning the portion of the buffer layer that is not covered by the channel, such that a thickness of the portion of the buffer layer below the channel is greater than a thickness of the portion of the buffer layer that is not covered by the channel.

3. The method for fabricating the active device according to claim 2, wherein the method of forming the channel and thinning the portion of the buffer layer that is not covered by the channel comprises:
   forming an etch mask on a region of the channel material layer where the channel is to be formed;
   etching a portion of the channel material layer that is not covered by the etch mask to form the channel, and continuing to etch the portion of the buffer layer that is not covered by the channel; and
   removing the etch mask.

4. The method for fabricating the active device according to claim 1, wherein the step of forming the channel comprises:
   patterning the channel material layer and the buffer layer simultaneously to form a channel layer and a buffer layer having two thicknesses.

5. The method for fabricating the active device according to claim 1, further comprising, after the gate is formed and before the source and the drain are formed, forming a first insulation layer to cover the gate and the gate insulation layer, with the source and the drain passing through the first insulation layer and the gate insulation layer to be connected with the channel.

* * * * *